United States Patent [19]

Hyatt et al.

[11] Patent Number: 4,726,991

[45] Date of Patent: Feb. 23, 1988

[54] ELECTRICAL OVERSTRESS PROTECTION MATERIAL AND PROCESS

[75] Inventors: Hugh M. Hyatt, Pacific Grove; Karen P. Shrier, Half Moon Bay, both of Calif.

[73] Assignee: EOS Technologies Inc., New York, N.Y.

[21] Appl. No.: 883,933

[22] Filed: Jul. 10, 1986

[51] Int. Cl.[4] .......................... H01B 1/14; H01B 1/16; H01C 7/12; H01C 7/10
[52] U.S. Cl. .................................... 428/329; 428/329; 428/331; 428/403; 428/404; 174/127; 252/504; 252/506; 252/507; 252/511; 252/512; 252/513; 252/514; 252/516; 252/518; 252/519; 252/520; 338/21; 361/91; 361/127; 427/215; 427/216; 427/217
[58] Field of Search ................ 174/127; 252/504, 506, 252/507, 511, 512, 513, 514, 516, 518, 519, 520; 338/21; 361/91, 127; 427/215, 216, 217; 428/403, 404, 328, 329, 331

[56] References Cited

U.S. PATENT DOCUMENTS

| | | |
|---|---|---|
| 3,210,461 | 10/1965 | Berg et al. . |
| 4,103,274 | 7/1978 | Burgess et al. .................... 252/518 |
| 4,252,692 | 2/1981 | Taylor et al. . |
| 4,331,948 | 5/1982 | Malinaric et al. . |

FOREIGN PATENT DOCUMENTS 1177394  1/1970  United Kingdom .

*Primary Examiner*—James C. Cannon
*Attorney, Agent, or Firm*—Paul J. Sutton

[57] ABSTRACT

A material provides protection against electrical overstress transients having rise times as rapid as a few nanoseconds or less. The material comprises a matrix formed of a mixture of separate particles of conductive materials and separate particles of semiconductor materials coated with insulating material to provide chains of the particles within the matrix with interparticle separation distances along the chains less than several hundred angstroms, thereby to permit quantum-mechanical tunneling of electrons between the separate particles in response to high energy electrical transients.

36 Claims, 7 Drawing Figures

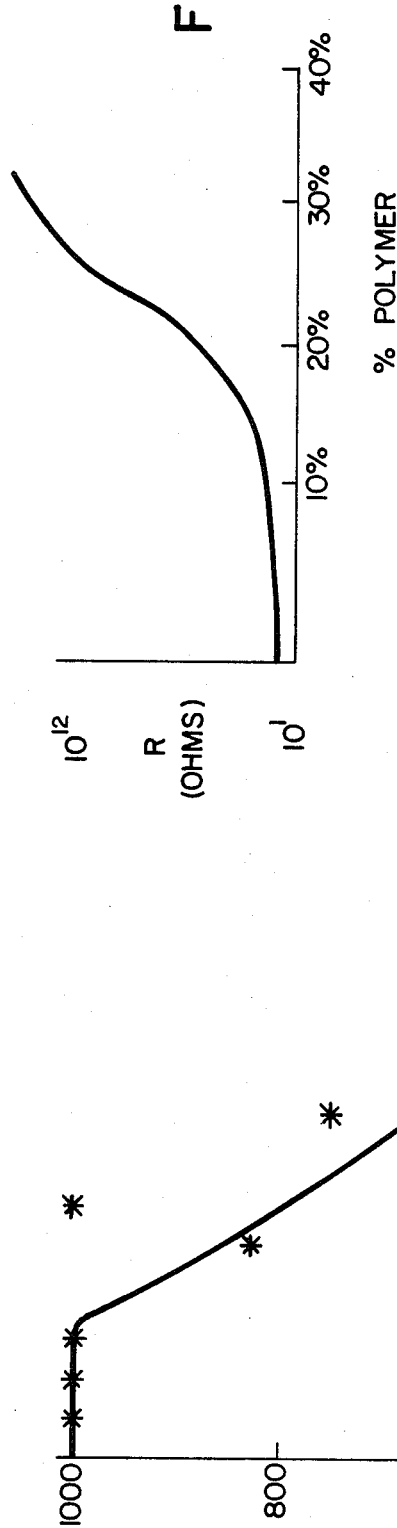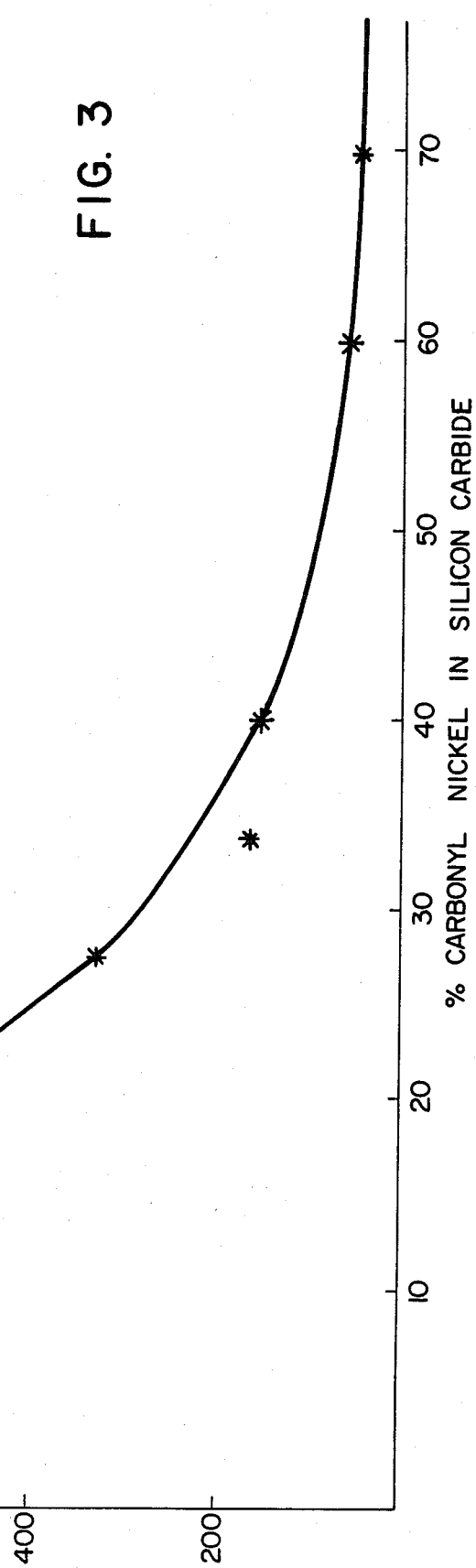

ELECTRICAL OVERSTRESS PROTECTION MATERIAL AND PROCESS

BACKGROUND OF THE INVENTION

1. Field of the Invention

The present invention generally relates to protection of electronic devices from electrical overstresses and, more particularly, the present invention relates to the protection of electronic devices from overstress transients with extremely fast rise times and high peak power.

2. State of the Art

It is well known that electronic circuitry must be protected from transient voltage and current conditions which exceed the capacity of the circuitry. Such electrical transients can damage circuitry and can cause errors in operation. Particularly, protection from electrical overstress disturbances is required for modern electronic communication and control systems whose solid-state microelectronic components are highly sensitive to excessive currents and voltages.

Various devices and methods are known for providing protection from limited electrical overstresses. At the most basic level, it is common to shield electronic devices from electromagnetic transients with grounded wire screen enclosures. Such shielding, however, does not protect electronic devices from transient electrical overstress disturbances which penetrate into shielded circuits via connecting conductor lines. To protect circuitry from such transient overstress disturbances, a variety of protective devices are conventionally used singularly or in combination. Such devices include fuses, spark gaps, varistors, zener diodes, transzorbs, thin-film devices, bypass capacitors, inductors and filters. These devices are often referred to as voltage suppressors or voltage arrestors, but can be generally described as electrical overstress (EOS) protection devices. In use, EOS protection devices are connected between a circuit to be protected and ground, or between a conducting line leading to a circuit to be protected and ground. Their purpose is to shunt EOS transients to ground before energy resulting from the transients can damage protected circuitry.

For present purposes, an EOS transient can be defined as a transient voltage or current condition that can damage or upset normal operation of circuits. Electrical overstress transients of practical concern may arise from an electromagnetic pulse (EMP), lightning, or an electrostatic discharge (ESD). Such transients may rise to their maximum amplitudes in periods ranging from less than a few nanoseconds to several microseconds, and may be repetitive. In the rollowing, EOS transients are sometimes also referred to as pulses and surges.

A common example of an ESD overstress transient arises when there is a build-up of static electricity on persons wearing insulating clothing in carpeted offices. The ESD transients at time of discharge can include voltages exceeding 20,000 volts and currents of more than 40 amperes; such transients can upset or destroy electronic components in computers and other electronic devices. ESD transients may reach peak discharge voltages in less than a few nanoseconds and, as such, are faster than conventional overstress protection devices.

Lightning is another example of an EOS transient capable of adversely affecting electronic circuits. A lightning strike as near as several miles can radiate sufficient electromagnetic energy to generate pulse amplitudes of several thousand volts on power lines. Typically, the time to peak of lightning-caused transients is several microseconds and, thus, such transients are several thousand times slower than ESD transients.

EMP transiants are generated by nuclear weapons or other high-energy directed devices. A nuclear explosion, for example, may generate electric fields in excess of 50,000 volts per meter over a radius of more than 600 miles. The peak amplitudes of such fields can be reached in a few nanoseconds and the resulting EOS transients can disable communication equipment as well as other electronic devices.

EMP-caused threats to microelectronic components, especially junction field effect transistors and microwave diodes, are discussed by H. R. Philipp and L. M. Levinson in an article entitled "NbO Devices for Sub-nanosecond Transient Protection", J. App. Phys. 50(7). July 1979. The authors emphasize that conventional devices are intended to protect power or low-frequency circuits against lightning or switcning surges, and do not provide adequate protection against fast rise-time EMP transients. (The rerm "rise time" refers to the time required for a transient to reach maximum amplitude.)

A simple example of a device to protect against electrical disturbances is an ordinary fuse. Fuses are sensitive to current flow in power lines and, in high current situations, are heated to the point of rupture; after rupture, fuses create open circuit conditions. Because heating requires significant time, fuses are not acceptable in situations where extremely rapid responses are required. For example, fuses do not adequately respond to EOS transients with rise times of a few microseconds. In addition, fuses are unacceptable in many electrical overstress protection situations because, after responding to an EOS condition, fuses irreversibly and destructively break down and must be replaced. A more desirable property would be for fuses to automatically recover their protective abilities after protecting against an EOS transient.

In fact, the ability to automatically recover protective properties is available to some extent in many conventional overstress protection devices, particularly varistors. Varistors usually have a characteristic known as a "clamping" voltage. For applied voltages below the clamping value, a varistor provides high resistance and, therefore, essentially acts as an open circuit. On the other hand, for applied voltages which substantially exceed the clamping value, a varistor provides substantially reduced resistance to shunt high-amplitude electrical transients to ground. Accordingly, when a varistor is connected to a line carrying signals, the varistor will not affect signals on the line at ordinary voltage levels but will shunt high amplitude EOS disturbances, at least ones with relatively slow rise times.

The property of exhibiting high resistance at voltages below a clamping level and low resistance at voltages above the clamping level will be referred to herein as non-linear resistance (NLR). Various materials are known to have NLR properties; a common example is zinc oxide. Such materials are used in numerous overstress protection devices; for example, varistors are often fabricated from zinc oxide particles. When such materials are in a high resistance state, the materials are said to be in the "off-state"; when the materials are in a low resistance state, the materials are said to be in the "on-state".

Varistors are commercially available with sufficient capacities to provide overstress protection against relatively large amounts of transient energy such as encountered in lightning surges. However, one shortcoming of varistors is their relatively high capacitance, which delays response times. The structure and operation of varistors is described in "The Transient Voltage Suppression Manual", fourth edition, published in 1983 by General Electric Company, U.S.A. According to the manual, varistors have the capacity to handle up to 200 joules of energy with current flows of up to 6000 amperes. The microstructure of varistor material is comprises of grains of sintered metal oxide powder having the property that the voltage drops across intergranular boundaries are nearly constant, usually at about 2–3 volts per grain boundary junction, independent of grain size.

A particular varistor material is suggested in U.S. Pat. No. 4,103,274. According to this patent, a varistor can be fabricated from polycrystalline meral oxide materials and, specifically, composite metal oxide ceramic particles in plastic resin matrices.

Various otner devices commonly used in electronic circuits exhibit NLR behavior and have been utilized to provide electrical overstress protection. Typical examples of such devices are semiconductor diodes, transistors, and zener diodes. Specifically, zener diodes have the property of providing nearly infinite resistance until an applied voltage reaches a threshold value and, thereafter, providing rapidly decreasing resistance. Although relatively fast in response time as compared to other overstress protection devices, zener diodes exhibit some capacitance and, thus, provide substantial time delays when encountering EOS transients having rise times measured in nanoseconds or less. Also, practical zener diodes have relatively limited operating regions and lack capacity to handle large amounts of energy.

Zener diodes and other conventionally used EOS protection devices also usually exhibit substantial "overshoot" when encountering rapid transients such as those caused by an EMP. The term overshoot refers to the amount by which transient voltage exceeds the clamping voltage of an overstress protection device prior to the time the device becomes conductive. In diodes for example, overshoot can arise because of inductance in the leads and because of the time required to charge the p-n junction diffusion layers in the diodes. Because circuitry connected to an overstress protection device can be damaged during an overshoot period, overshoot ordinarily should be minimized both in extent and duration.

Spark gap devices also have relatively substantial energy handling capabilities for EOS protection. In operation, spark gaps conduct by forming highly ionized conducting channels with nearly negligible resistance. Because time periods up to several microseconds are required for spark gap devices to absorb enough energy to generate such channels, spark gap devices exhibit substantial overshoot before becoming highly conductive. Also, after a spark gap device becomes conductive at low resistance levels, it may short-out protected circuits.

Thin-film devices for providing EOS protection include various discrete solid-state materials wherein current is conducted in narrow channels. The channels typically are only sub-micron to micron in size and, therefore, can absorb only relatively small amounts of energy before becoming thermally limited. In practice, thin-film devices exhibit substantial overshoot and may lose their recovery properties after reacting to a relatively small number of such transients.

Filters usually comprise combinations of resistors, capacitors, inductors and solid state elements such as diodes, transistors and operational amplifiers. Filters have limited application in protecting against severe EOS transients since, by definition, filters allow certain frequencies to pass while blocking other frequencies. For example, capacitors conduct nigh-frequency signals but block low frequency ones. Because many fast rise time transients contain broad bands of frequencies, including very high or low frequency components, conventional filters provide inadequate EOS protection.

In view of the preceding, it can be appreciated that conventional devices and materials provide inadequate protection when encountering electrical transient disturbances having rise times less than a few nanoseconds and broad frequency spectrums. In addition, individual types of overstress protection devices each have their own shortcomings, particularly failure to recover protective properties after encountering repeated EOS transients having high energies and rapid rise times.

OBJECTS AND SUMMARY OF THE INVENTION

A primary object and advantage of the present invention is to provide an improved nonlinear resistance material to protect circuits from repetitive electrical transients having rise times as rapid as a few nanoseconds or less.

More particularly, an object and advantage of the present invention is to provide an electrical overstress protection material with non-linear resistance properties that has the ability to repetitively respons to transients with nanosecond rise times, has minimal or controllable overshoot, and has the capacity to handle substantial energy.

Still more particulary, an object and advantage of the present invention is to provide a non-linear resistane material of the above-described characteristics which can be selectively formulated, by choosing different compounds or different geometries, to selectively clamp at voltages ranging from five (5) to ten thousand (10,000) volts.

In summary, the present invention provides a non-linear resistance material to provide electrical overstress protection comprising a generally homogeneous mixture of discrete particles of conductive materials having sides less than about several hundred microns, discrete particles of semiconductor materials also having sizes less than about several hundred microns, and insulator material coating the separate particles. The particles are mixed generally homogeneously within the matrix to provide a myriad of chains of particles with interparticle separation distances sufficiently small to permit substantial conduction between particles by quantum-mechanical tunneling of electrons. In the preferred embodiment, the marerial of the present invention further includes a binder or packaging material in which the particles of conductive material and semiconductor material are generally homogeneously mixed.

Further, the present invention provides a process for formulating a non-linear resistance material to protect against electrical transients having rise times as rapid as a few nanoseconds or less, comprising the steps of providing separate particles of conductive materials and of semiconductor materials, the sizes of the particles being less than about several hundred microns; separately coating each of the particles with insulating material with the depth of the coating being not more than several hundred angstroms; and mixing the coated particles of conductive material with the coated particles of semiconductor material to form a generally homogeneous matrix with a myriad of chains of adjacent particles closely spaced to one another to allow substantial electron transport between adjacent particles by quantum-mechanical tunneling in response to applied electrical transients.

A particular advantage of the overstress protection material of the present invention is that it can be readily fabricated in a wide variety of shapes for connection to various electrical and electronic devices including antennas, electrical and electronic circuits, interconnection harnesses, printed circuit boards, and integrated circuit elements.

Further objects and advantages of the present invention may be ascertained by those skilled in the art from the following description and appended drawings, which are offered by way of example of the preferred embodiment of the present invention.

BRIEF DESCRIPTION OF THE DRAWINGS

FIG. 3 is a graph of clamping voltage versus the weight ratio of conductor material for a particular formulation of the material of FIG. 1;

FIG. 4 is a graph of off-state resistance versus polymer content (by weight) for another particular formulation of the material of FIG. 1;

DETAILED DESCRIPTION OF THE PREFERRED EMBODIMENT

Figure 1:
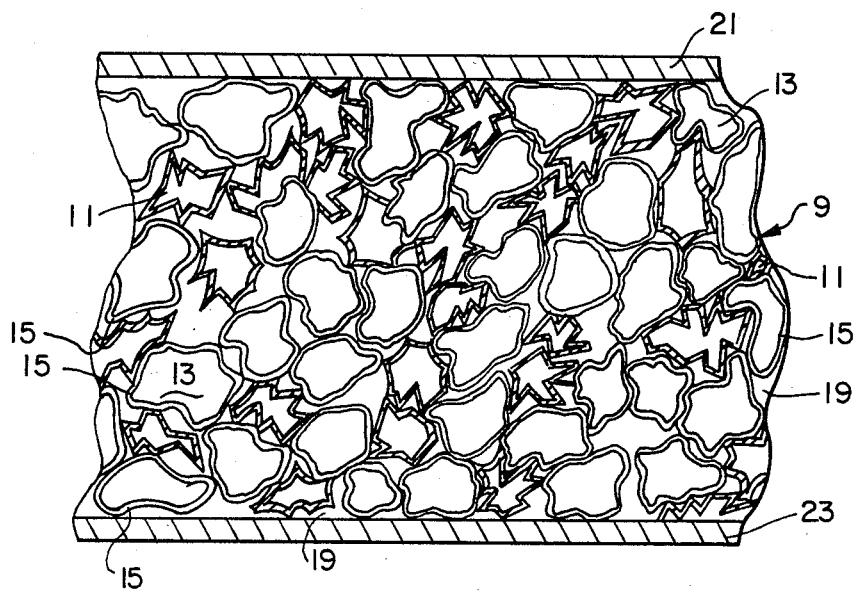
FIG. 1 is a schematic view to an enlarged scale of a cross-section of material according to the present invention.

As shown in FIG. 1, an electrical overstress protection material according to the present invention comprises a matrix, shown generally at numeral 9, of randomly mixed separate conductor particles 11 and semiconductor particles 13 closely spaced to one another, but structurally separated by insulating material 15 thin enough to permit quantum-mechanical tunneling of electrons between particles 11 and 13. The interstitial volumes between conductor particles 11 and semiconductor particles 13 are filled with binder material 19. The section of matrix material 9 shown in FIG. 1 is held between upper and lower plate-like metallic electrodes 21 and 23, respectively. It should be noted that the dimension of matrix 9 separating the two electrodes 21 and 23 exceeds several multiples of the sizes of particles 11 and 13. The configuration of electrodes 21 and 23 is a matter of design choice.

For purposes of generally understanding the function of matrix material 9, it may be assumed that electrode 21 is connected to circuitry to be protected from EOS transients and that electrode 23 is connected to system ground. Thus, matrix material 9 acts as an intermediary between electrodes 21 and 23.

The characteristics of matrix material 9 include high resistance (usually more than $10^9$ ohms per centimeter) in the off-state and low resistance (usually about 1 to 1000 ohms per centimeter) in the on-state. Further, the matrix material 9 is capable of switching from the off-state to the on-state in periods less than one nanosecond in response to EOS transients with sub-nanosecond rise times. Such responses of the matrix material 9 can occur without substantial overshoot. In addition, matrix material 9 has a surprising ability to maintain its capability to switch between the on and off-states after enduring repeated high-energy transients with voltages as high as 50 thousand volts.

In matrix material 9, conductor particles 11 are less than about 100 microns in size and can be as small as 100 angstroms in the case of carbon black powder. The preferred range of particle sizes for semiconductor particles 13 is generally from about one-tenth micron to about 100 microns with relatively few particles being outside of the range. In practice, the number of particles exceeding the upper limit of the ranges is minimized because larger particles tend to form single conduction paths that adversely affect the properties of matrix material 9, particularly survivability to repeated transients, and may cause catastrophic dielectric breakdown.

Figure 2:
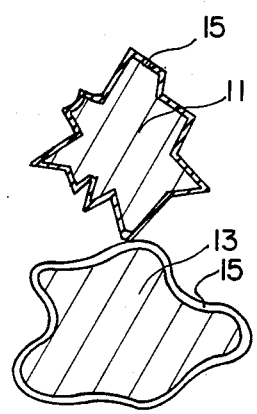
FIG. 2 is a fragmentary view, drawn to a further enlarged scale, of the material of FIG. 1.

As best shown in FIG. 2, conductor particles 11 and semiconductor particles 13 are individually coated with electrical insulating material 15. In practice, insulating material 15 can itself comprise particles ranging in size from about 70 angstroms to about 300 angstroms. As such, the insulating particles are about one tenth to one ten-thousandth the size of coated conductor and semiconductor particles 11 and 13.

In practice, conductor particles 11 are preferably formed of carbonyl nickel, specifically INCO type 255 carbonyl nickel powder. However, conductor particles 11 for use in matrix material 9 can be comprised of other practical conductive materials as illustrated by tantalum carbide, titanium carbide, nickel other than carbonyl nickel, tungsten carbide, boron carbide, zirconium carbide, carbon black, graphite, copper, aluminum, molybdenum, silver, gold, zinc, brass, cadmium, bronze, iron, tin, beryllium, lead, borides, and Mu-metal.

The conductor material from which conductor particles 11 are formed should have resistivities ranging from about $10^{-1}$ ohms per centimeter to about $10^{-6}$ ohms per centimeter. The resistivities of some suitable materials are as follows:

$1 \times 10^{-4}$ ohms/cm: titanium carbide
$7 \times 10^{-5}$ ohms/cm: columbian carbide
$2 \times 10^{-5}$ ohms/cm: tantalum carbide
$1 \times 10^{-5}$ ohms/cm: tungsten carbide
$6 \times 10^{-5}$ ohms/cm: zirconium carbide In some applications, it is advantageous to form conductor particles 11 from metal silicides because such materials have metal-like resistivities and high-temperature stability. Numerous metal silicides that are suitable for conductor particles 11 are set forth in *Silicides for VLSI Applications*, S. P. Murarka (Academic Press, 1983), pp. 30 and 31.

FIGS. 1 and 2 show that conductor and semiconductor particles 11 and 13 have generally irregular configurations with numerous sharp points or spicules. These shapes, in fact, have certain advantages. Materials that have spicules, such as carbonyl nickel, ennance interparticle electric fields and, thus, promote conduction in matrix material 9. A particular benefit of field enhancement is to increase the speed of switching of matrix material 9 between the off and the on-states in response to EOS transients with rapid rise times.

Semiconductor particles 13 can be comprised of any conventional semiconductor material. Among the preferred materials are included materials such as silicon carbide, beryllium carbide, calcium oxide, chalcogenides, doped silicon, niobium oxide, vanadium oxides, indium antimonide, iron oxide, boron carbide, selenium, lead sulphide, lead telluride, cadmium sulphide, zinc sulphide, silver sulphide, titanium dioxide, boron, selenium, tellurium, germanium, and vanadium carbide. Organic semiconductors and semiconductors made by the sol-gel process can also be used.

FIG. 3 shows the effect upon clamping voltage of various compositions of matrix material 9 in terms of percentages of conductor material and semiconductor material. The clamping voltages were measured based upon repeated application of a 1000 volt pulse. The particular matrix material utilized for the tests was composed only of nickel as a conductor and silicon carbide as a semiconductor. The test results indicate that the clamping voltage approximates the magnitude of the applied transient until the percent composition of the conductor material increases ro more than about ten percent (10%). If the relative percent of conductive particles is increased to over about fifty percent (50%), the clamping voltage decreases to a relatively small fraction of the magnitude of the applied pulse.

Generally speaking, insulating material 15 which coats particlas 11 and 13 must be fabricated thinly enough to allow quantum-mechanical tunneling to occur between closely adjacent particles without catastrophic dielecrric breakdown. (As the term is utilized herein, catastrophic dielectric breakdown means the irreversible formation of short circuit paths through matrix material 9.) Suitable insulating material 15 can be provided in the form of small particles or as thin film-like coatings. A film-like coating can be provided, for example, by reacting conductor particles 11 in the presence of oxygen to form metal oxide surface layers on the particles. (Such reactions are accomplished, of course, prior to admixing conductor particles 11 in matrix material 9.) Also, insulating material 15 must be a type of marerial which can reside in matrix material 9 without chemical reaction with other materials in the matrix.

In practice. insulating material 15 is preferably a type of fumed silicon dioxide such as that available under the trademark Cab-O-Sil. Other suitable insulating materials include kaolin, kaolinite, aluminum trihydrate, feld spar, various forms of silica, glass spheres, calcium carbonate, barium sulphate, and calcium sulphate.

One function of insulating material 15 is to provide closely controlled structural separation between conductor particles 11 and semiconductor particles 13. In order for the beneficial properties of matrix material 9 to be fully realized, a large number of conductor particles 11 and semiconductor particles 13 should be only separated from one another by distances ranging from approximately fifty (50) angstroms to several hundred angstroms. Optimal interparticle spacing depends upon the elements from which the semiconductor and conductor particles are formed and upon expected applied electrical fields. In any event, a substantial number of the interparticle spacing should be sufficiently small to permit electrical conduction between closely adjacent conductor particles 11 and semiconductor particles 13 by quantum-mechanical tunneling of electrons, on average for the bulk material, in response to electrical transients.

In the absence of insulating material 15, matrix material 9 does not recover to a high resistance state following a high energy overstress disturbance but, instead forms a relatively permanent, low resistance shunt to ground. The capability of matrix material 9 to react to high-energy transients and then return to a high resistance state may be called "survivability".

Another purpose of the insulating material 15 is to provide sufficient physical separation of conductor particles 11 from one another to provide high off-state resistance. In the absence of insulating material 15, adjacent conductor particles 11 could form conducting chains through matrix material 9 and cause the off-state bulk resistance of matrix material 9 to be unacceptably low.

Binder material 19 can range from materials in the solid state to materials in the fluid (gas or liquid) state. In the solid or semi-solid state, binder material 19 provides interparticle spacing as well as filling interstitial voids between particles 11 and 13. Although solid binder materials can provide mechanical binding between particles, this function is not critical, but is convenient to allow matrix material 9 to be readily fabricated to various sizes and shapes as desired to interface with protected components. When mechanical binding is not provided between particles, a structural container for matrix material 9 must be provided. The type of container or packaging is a matter of design choice and can be conventicnal. Suitable packaging materials include, but are not limited to, ceramic, epoxy, polymer, paint, oil, and metal. Typically, an insulating container is provided with electrodes appropriately placed for substantial contact with contained matrix material 9.

Generally speaking, binder material 19 is an electrical insulating material having resistivity ranging from about $10^{12}$ to about $10^{15}$ ohms per cm. In practice, binder material 19 is preferably a thermoset polymer including epoxies, thermoplastic, rubber, or polymer alloys and blends. Binder material 19 also can be comprised of other conventional electrical insulating materials; among the materials suitable in various instances are included ceramic, oil, fumed silica, and even water, air, vacuum, and gasses such as $N_2$ and $SF_6$.

Because binder material 19 is an electrical insulator, it can affect clamping voltages of the matrix material 9. For example, matrix materials with the same weight percent composition of semiconductor particles 13 and conductor particles 11 can provide different clamping voltages depending upon the specific type of binder material 19 utilized. This effect is primarilly a function of the dielectric constant of the binder material 19. Thus, a benefit of forming binder material 19 from a polymer is to reduce the overall dielectric constant of matrix material 9 which normally should be small if matrix material 9 is required to have low capacitance. If higher capacitance is needed (as where matrix material 9 is used in the design of circuit elements such as strip lines, PCB materials, cables, coaxial connectors or other devices where transmission line impedance is important), the dielectric constant of binder material 19 can be selectively increased to provide capacitive impedance as desired.

Binder material 19 also affects off-state resistance of matrix material 9. Thus, FIG. 4 shows off-state resistance as a function of percentage by weight of a polymer binder material 19. It should be noted that the vertical axes of the graph of FIG. 4 is logarithmic. The amount of binder material 19 required to significantly change off-state resistance of matrix material 9 typically ranges from in excess of about ten percent (10%) to about thirty-five percent (35%) by weight, with matrix material 9 being relatively conductive until the binder material content is increased to about thirty percent (30%).

To further control resistance in the off and on states, plasticizers and coupling agents can be added to binder marerial 19. In practice, we have found that addition of 1-5% plasticizer by weight in the range of 10,000 cps through 20 cps causes off-state resistance of matrix material 9 to vary by as much as 6 decades.

A particular example of a formulation, by weight, of matrix material 9 is 2% Cab-O-Sil, 12% carbonyl nickel, 30% epoxy and 56% silicon carbide. An even more typical example of a formulation of matrix material 9 is 22.5% carbonyl nickel, 43% silicon carbide, 2.5% Cab-O-Sil, and 32% epoxy. In these formulations, conductor particles 11 are formed of carbonyl nickel, semiconductor particles 13 are formed of silicon carbide, insulating material 15 is Cab-O-Sil, and binder material 19 is epoxy. In a typical formulation, by weight, matrix material 9 would generally contain from about 1% to 50% conductive particles 11.

Figure 5:
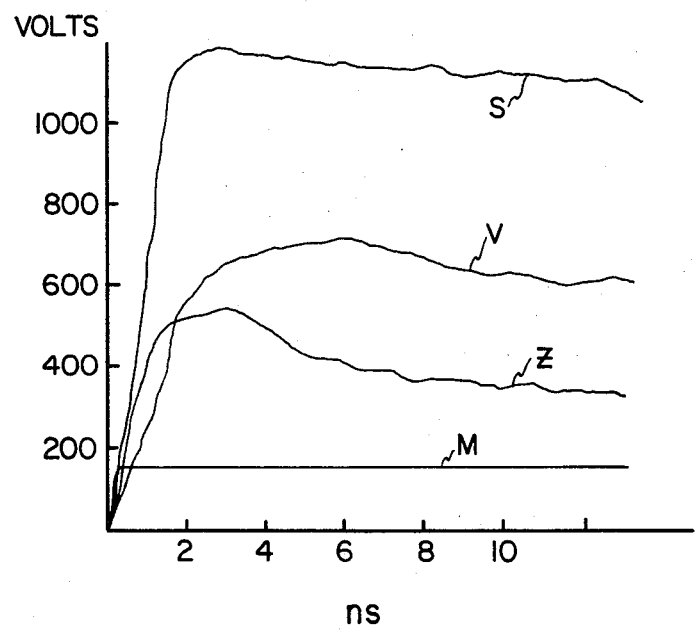
FIG. 5 is a graph of voltage versus time for a typical overstress applied to various overstress protection devices and materials including the material of the present invention.

Materials according to the present invention have been shown to respond surprisingly effectively to electrical overstress transients with rise times less than about 0.5 nanoseconds. When responding to EOS transients having rise times to peak longer than 0.3 nanoseconds and shorter than 1-2 nanoseconds, various formulations of matrix material 9 have been found to not exhibit significant overshoot. FIG. 5 illustrates typical behavior of matrix material 9 in response to electrical transients having about one (1) joule of energy. Further, FIG. 5 illustrates transient conditions which occur when the same transient is applied to other (conventional) overstress protection devices. For example, curve "S" in FIG. 5 illustrates voltages which appear across a typical spark gap device encountering the same overstress transient. Curve "V" illustrates the voltage conditions which appear across a typical varistor subjected to the same transient. Likewise, curve "Z" shows voltages across a typical zener diode which endures the same transient.

In FIG. 5, the curve "M" for matrix material 9 quickly becomes a nearly constant function equal to a clamping value $V_c$. It should be noted that clamping voltage $V_c$ depends upon the composition of matrix material 9 and upon the electrical characteristics of the EOS transient and the load protected by the matrix material. Generally speaking, the greater the magnitude of a transient applied to matrix material 9, the higher clamping voltage Vc will be. It should also be noted that the other overstress protection devices in FIG. 5 approach clamping voltages, but not as quickly as matrix material 9. Also, the clamping voltages approached by the other deviccs do not necessarily have the same magnitude as voltage Vc.

For the conventional overstress protection devices in FIG. 5, the spark gap device exhibits the greatest overshoot, exceeding its clamping voltage by approximately 1,000 volts. The second largest overshoot is associated with the varistor, which exceeds its clamping voltage by more than 400 volts. By way of contrast, matrix material 9 exhibits negligible overshoot.

The time at which voltage achieves the clamping value in response to an EOS transient can be called "clamping time", and the effectiveness of protection provided by overstress devices can be defined in terms of clamping times. In FIG. 5, the clamping time of the zener device is approximately 2 nanoseconds. It can be seen that matrix material 9 provides substantially shorter clamping times than the other overstress protection devices and materials, and thus is more effective. As to this aspect of FIG. 5, it should be emphasized that the same voltage was applied to the conventional devices as to matrix material 9, and that the conventional devices were selected as representative of devices which would, in practice be used under similar circumstances. Thus, FIG. 5 shows relative performance of conventional devices as compared to matrix material 9.

Figure 6:
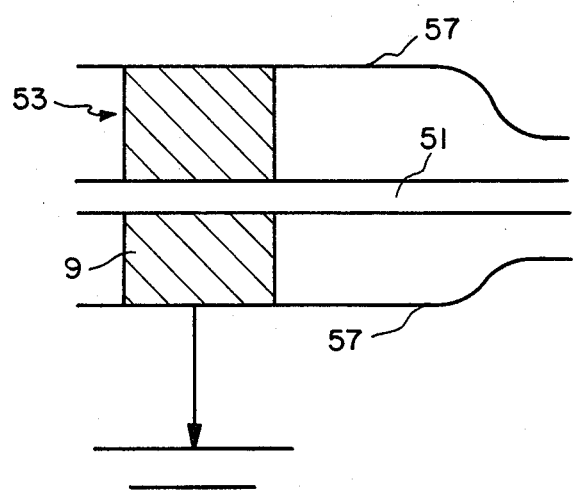
FIG. 6 is a schematic representation of an overstress protection device fabricated from the material of FIG. 1.

FIG. 6 shows a conductor line 51 protected by a device, generally designated by numerals 53, formed from matrix material according to the present invention. Line 5 should be understood to be any type of conductor which carries electrical signals or power to a network requiring EOS protection. In the embodiment illustrated in FIG. 6, device 53 is a hollow cylindrical section of matrix material interposed between line 51 and a cylindrical sheath 57 with the interior surface of the cylindrical section in physical contact with line 51 and the radially outward surface of cylindrical section connected to ground.

In operation of the device of FIG. 6, under normal conditions, conductor 51 conveys signals to a protected circuitry. At normal potential differences between conductor line 51 and ground, the resistance of the matrix material is sufficiently high that negligible current is conducted through the matrix material. Upon the occurrence of a high-energy EOS disturbance, however, the voltage on conductor 51 increases substantially and the resistance of the matrix material decreases dramatically enough to provide an electrical shunt from conductor 51 to ground. The current which flows through matrix material is the sum of current due to the EOS disturbance and current through conductor 51 due, in effect, to its being shorted to ground. Thus, the energy handled by matrix material 9 is the sum of the energy dissipated from the transient plus energy injected into the material from electrical systems to which line 51 is connected. The shunt current continues as long as the potential of conductor 51 is above the clamping voltage of the matrix material.

From a practical standpoint, the greater the required energy carrying capacity, the greater the required volume of matrix material in an EOS protection. If a protected article is a single microelectronic component, for example, the required volume of matrix material is relatively small. On the other hand, if a protected circuit should include a massive antenna, the required volume would be relatively large. As a rule of design, matrix material according to the present invention conducts approximately ten (10) or more joules of energy per cubic centimeter, but this ratio can vary substantially depending upon the materials comprising the matrix material. In practice, the matrix material conveys between 0.5 to several hundred joules of energy depending upon the mass of the matrix material.

Operation of matrix material 9 will now be described in greater detail. Initially it may be assumed that a suitable mass of matrix material 9 is connected between ground and a protected electronic component, or a conductor associated therewith, and that a high energy EOS transient has occurred which threatens the protected circuitry. When the transient reaches matrix material 9, electric fields associated with the transient quickly rise across the material and associated electrical fields also rise across each particle and each interparticle junction or barrier within the material. The fields can initiate several conduction mechanisms simultaneously, and various transport phenomena may predominate depending upon the time elapsed after the beginning of the transient. For example, current may flow through matrix material 9 between adjacent conductor particles 11, or through junctions between adjacent semiconductor particles 13, or between adjacent semiconductor and conductor particles. Thus, as long as the voltage of the EOS transient is above the clamping level of matrix material 9, a multitude of current paths exist within any section of matrix material 9 along chains of particles 11 and 13.

With respect to conductor particles 11, electric fields are excluded from the interior volumes of the particles. This increases fields across the semiconductor particles and across the insulating material junctions. The fields are further enhanced where conductor particles 11 have sharp points. Thus, when resistance in a particular chain of adjacent conductor particles 11 is small enough, current flows through the chain consistent with the ohmic resistivity of the conductive particles 11 and the strength of the applied electric field.

Semiconductor particles 13 can be understood to be individual non-linear resistance elements. When an applied electric field rises across semiconductor particles 9, the composition of the semiconductor material controls the change in individual particle conductivity and, hence, the conductance of the chains of semiconductor particles 13 carrying current through matrix material 9. In other words the number and composition of semiconductor particles 13 generally determines the bulk resistance of matrix material 9. Voltage drops across the barrier junctions comprised of insulating material 15 also contribute to the bulk on-state resistance of matrix material 9. Thus, the total conductance of matrix material 9 is directly related to the series-parallel sum of all voltage drops for conductor particles 11, semiconductor particles 13 and the barrier junctions provided by insulating material 15 and binder material 19.

Figure 7:
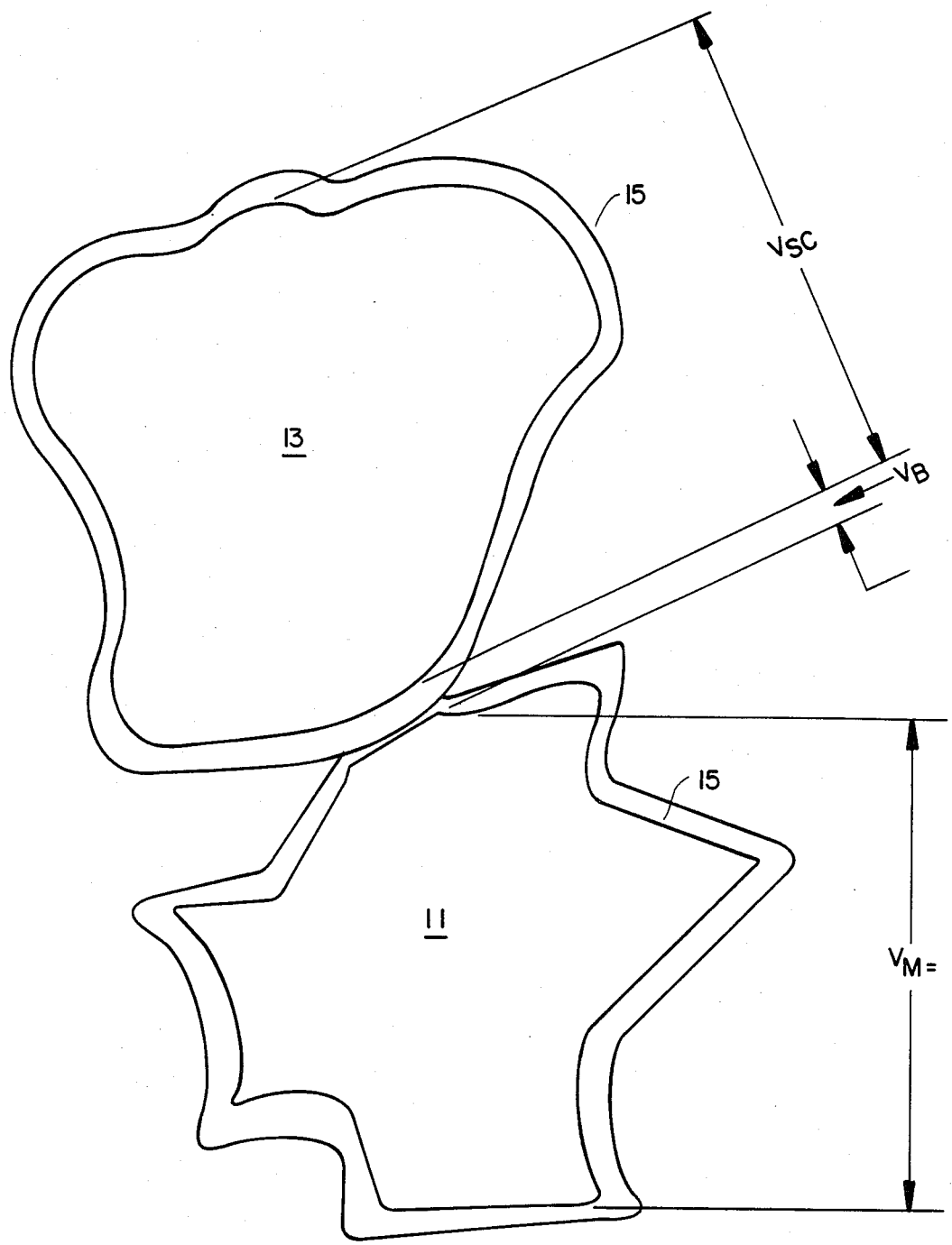
FIG. 7 is a schematic diagram which illustrates potential drops across particles within the material of FIG. 1.

In the context of FIG. 7, the voltage drop across semiconductor particle 13 is indicated as $V_{SC}$, the voltage drop across conductor particle 11 is indicated as $V_M$ and the potential drop across insulating material 15 separating the two particles is indicated as $V_B$ (the barrier potential). Thus, FIG. 7 can be understood to illustrate a partial chain (two particles) within matrix material 9. The total potential difference along this chain as the sum of $V_{SC}$ plus $V_B$ plus $V_M$.

Further with regard to FIG. 7, it may be noted that the coating of insulating material 15 is somewhat displaced in the area where particle 11 abuts particle 13. In practice, mixing of particles to form matrix material 9 or improper coating of the particles sometimes results in conductor material directly contacting semiconductor materials, or conductor material in one particle directly contacting conductor material in another particle, or semiconductor material in one particle directly contacting semiconductor material in another particle. Such irregularities, as long as they represent relatively isolated instances, do not adversely affect performance of matrix material 9.

After initiation of electron transport by quantum-mechanical tunneling, other transport mechanisms begin to predominate. For example, thermionic emissions of electrons likely occurs nearby simultaneously with tunneling. Also, electron transport by avalanche and zener breakdown and field emission effects can occur. The consequence of the cummulation of such electron transport mechanisms is to provide matrix material 9 with highly non-linear resistance qualities in the presence of applied fields created by transients with fast rise times.

As the field generated by an EOS transient decreases, the energy barriers at junctions between conductor particles 11 and semiconductor particles 13 increases relative to the energy of the electrons attempting to traverse the barriers. (In the context of FIG. 7, the energy barriers at the junctions are designated as voltage drop $V_B$.) Consequently, matrix material 9 becomes rapidly more resistive as the amplitude of a transient decreases, and the shunting behavior of the material rapidly decreases.

A primary goal in fabricating matrix material 9 is to provide a myriad of chains of adjacent particles with interparticle separation distances along the chains being small enough that electron transport through insulating material 15 separating the particles is initially dominated by quantum-mechanical tunneling of electrons. In other words, conductor particles 11 and semiconductor particles 13 are sufficiently closely separated by insulating material 15 that the junctions between particles forming chains or webs can properly be called tunnel junctions. For present purposes, a tunnel junction can be defined as an interparticle spacing less than several hundred angstroms. At tunnel junctions in the presence of applied electric fields, electrons pass through insulating material 15 even though the theoretical energy barrier imposed by the junction exceeds the energy of at least some of the electrons which are transported through the barrier. The explanation of such behavior depends upon a probabilistic model of electron behavior, and electrons which traverse the junction barriers are said to do so by "tunneling" rather than because their energies exceed the barrier energy. Because tunneling currents occur nearly instantaneously with applied fields exceeding a minimum value, thus, it is believed that the relatively fast response times of matrix material 9 are due to transport of electrons by quantum-mechanical tunneling when applied fields are high, insulating material 15 presents thin effective barrier widths and semiconductor particles 13 are small. Further, enhancement of conduction by quantum-mechanical tunneling relative to other transport phenomena is not only important to the response time of matrix material 9 but also increases the survivability of the material (i.e., decreases breakdown failures).

In the preferred process for fabricating matrix material 9, conductor particles 11 are individually coated with insulating material 15 and, likewise, semiconductor particles 13 are individually coated with insulating material 15. (In the present context, formation of an oxide layer on conductor particles 11 can be considered to be included within the "coating" step.) Then coated conductor particles 11 are mixed with binder material 19, and coated semiconductor particles 13 are added to the mixture. (In instances where binder material 19 is utilized and is a suitable electrical insulator, conductor particles 11 may be coated by mixing with the binder.) Depending upon binder material 19, curing may be necessary. In fabricating matrix material 9, it is important that conductor particles 11 and semiconductor particles 13 be homogeneously mixed. In the absence of homogeneous mixing, numerous continuous chains of conductor or semiconductor particles might extend from one surface to another surface of the matrix material and prove deleterious to the properties of the material. Typically in a section of matrix material 9, about twenty-five to more than five hundred conductor and semiconductor particles separate opposite faces of the matrix material.

Although matrix material 9 has been described as being useful for providing protection against EOS transients, the material also has utility in applications to provide high speed switching of high power electrical circuits.

Although the present invention has been described with particular reference to the illustrated preferred embodiment, such disclosure should not be interpreted as limiting. Various alterations and modifications will no doubt become apparent to those skilled in the art after having read the preceding disclosure. Accordingly, it is intended that the appended claims be interpreted as covering all such alternative embodiments as fall within the true spirit and scope of the present invention.

We claim:

1. A non-linear resistance material to provide electrical overstress protection against electrical transients, the material comprising a matrix formed of a mixture of:
   (a) separate particles of conductive materials, the sizes of the majority of the conductive particles being less than about several hundred microns;
   (b) separate particles of semiconductor materials, the sizes of the majority of the semiconductor particles being less than about several hundred microns; and
   (c) inorganic insulating material coating the particles of conductive material and the particles of semiconductor material to provide chains of the particles within the matrix with interparticle separation distances along the chains less than about several hundred angstroms, on average, thereby permitting substantial non-linear conduction between particles in said chains by quantum-mechanical tunneling of electrons in response to electrical transients.

2. A material according to claim 1 further including binder material in which said particles are generally homogeneously suspended.

3. A material according to claim 1 wherein the conductive particles have sizes less than about 100 microns.

4. A material according to claim 3 wherein the sizes of the particles of semiconductor material range from about 0.1 microns to 100 microns.

5. A material according to claim 4 wherein the number of semiconductor particles having sizes less than the lower boundary of said range far exceeds the number of semiconductor particles having diameters greater than the upper boundary of said range.

6. A material according to claim 1 wherein the conductive particles include particles of carbonyl nickel.

7. A material according to claim 1 wherein the conductive particles include materials within the class including titanium carbide, nickel, tungsten carbide, boron carbide, zirconium carbide, carbon black, graphite, copper, aluminum, molybdenum, silver, gold, zinc, brass, cadmium, bronze, iron, tin, beryllium, lead, borides, tantalum carbide, and Mu-metal.

8. A material according to claim 5 wherein the conductive particles have resistivities ranging from about $10^{-1}$ to about $10^{-6}$ ohms per centimeter.

9. A material according to claim 2 wherein the percentage, by weight, of conductive particles in the material is greater than about 1% and less than about 45%.

10. A material according to claim 2 wherein the binder material is an electrical insulator.

11. A material according to claim 10 wherein the binder material is a polymer.

12. A material according to claim 10 wherein the percentage, by weight, of the binder material is greater than about ten percent (10%) of the matrix material.

13. A material according to claim 10 wherein the binder material is selected from the class including thermoset polymers, thermoplastic, rubber, polymer alloys and blends.

14. A material according to claim 1 wherein the conductive particles have numerous sharp points to provide interparticle field enhancement.

15. A material according to claim 1 wherein the insulating material coats individual ones of the semiconductor particles.

16. A material according to claim 15 wherein the insulating material includes fumed silicon dioxide.

17. A material according to claim 16 wherein the fumed silicon dioxide includes Cab-O-Sil.

18. A material according to claim 1 wherein the insulating material coating the particles includes fumed silicon dioxide, haolin, kaolinite, aluminum trihydrate, feld spar, various forms of silica, glass spheres, calcium carbonate, barium sulphate, or calcium sulphate.

19. A material according to claim 2 wherein the binder material has resistivity ranging from about $10^{12}$ to about $10^{15}$ ohms per centimeter.

20. A material according to claim 1 wherein the conductive particles, the semiconductor particles and the insulator material are chosen to provide a clamping voltage of several hundred volts.

21. A process for formulating a non-linear resistance material to protect against electrical transients comprising the steps of:
   (a) providing separate particles of conductive materials and particles of semiconductor materials, the sizes of the particles being generally less than several hundred microns;
   (b) coating each of the particles of conductive materials and each of the particles of semiconductor materials with inorganic insulating material; and
   (c) mixing the coated particles of conductive materials with the coated particles of semiconductor materials to form a generally homogeneous matrix with a myriad of chains of adjacent particles wherein the particles are spaced apart by the insulating coating by no more than several hundred angstroms to allow substantial electron conduction between particles by quantum-mechanical tunneling in response to applied electrical transients.

22. A process according to claim 21 further including adding binder material to suspend the mixture of particles of conductive and semiconductor materials.

23. A process according to claim 21 wherein the particles of conductive materials are sized less than about 100 microns.

24. A process according to claim 23 wherein the particles of semiconductor material range in size from about 0.1 microns to 100 microns.

25. A process according to claim 21 wherein the particles of conductive and semiconductor material are separately coated with the insulating material prior to being mixed together.

26. A process according to claim 25 wherein the coated particles of conductive material are mixed with a binder material and then the particles of semiconductor material are mixed with the mixture of binder material and conductive particles.

27. A process according to claim 21 wherein the particles of conductive material include carbonyl nickel.

28. A process according to claim 21 wherein the conductive particles include materials within the class including titanium carbide, nickel, tungsten carbide, boron carbide, zirconium carbide, carbon black, graphite, copper, aluminum, molybdenum, silver, gold, zinc, brass, cadmium, bronze, iron, tin, beryllium, lead, borides, tantalum carbide or Mu-metal.

29. A process according to claim 22 wherein the percentage, by weight, of conductive particles in the material is greater than about 1% and less than about 45%.

30. A process according to claim 22 wherein the binder material is an electrical insulator.

31. A process according to claim 30 wherein the binder material is a polymer.

32. A process according to claim 30 wherein the percentage, by weight, of the binder material is greater than about ten percent (10%) of the matrix material.

33. A process according to claim 21 wherein the insulating material is coated upon individual ones of the semiconductor particles.

34. A process according to claim 33 wherein the insulating material includes fumed silicon dioxide.

35. A non-linearly resistance device for protecting against electrical transients, the device comprising:
(a) a matrix of a non-linearly resistive material consisting of a random mixture of separate particles of conductive materials and semiconductor materials with inorganic insulating material coating the conductive particles and the semiconductor particles to separate the particles in chains of particles of conductive materials and semiconductor materials by distance sufficiently small to permit quantum-mechanical tunneling of electrons between said particles in response to electrical transients; and
(b) electrode means for electrically coupling the matrix material between ground and an electrical means to be protected from electrical transients.

36. A device according to claim 35 further including insulating binder material in which said separate particles are generally homogeneously suspended.

* * * * *